United States Patent
Okamoto

(10) Patent No.: US 8,230,130 B2
(45) Date of Patent: Jul. 24, 2012

(54) INPUT DEVICE

(75) Inventor: Keisuke Okamoto, Osaka (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 12/915,883

(22) Filed: Oct. 29, 2010

(65) Prior Publication Data
US 2011/0106985 A1    May 5, 2011

(30) Foreign Application Priority Data
Oct. 29, 2009 (JP) .................. 2009-248518

(51) Int. Cl.
G06F 3/00    (2006.01)

(52) U.S. Cl. ........................................ 710/16
(58) Field of Classification Search ............ 710/16
See application file for complete search history.

(56) References Cited

U.S. PATENT DOCUMENTS
7,218,250 B2 *   5/2007   Laliberte et al. ............... 341/24
2009/0256806 A1 * 10/2009  Chen ........................... 345/172

FOREIGN PATENT DOCUMENTS
| JP | S60-086655  | 5/1985  |
| JP | H09-230983  | 9/1997  |
| JP | 2000-347795 | 12/2000 |
| JP | 2003-177859 | 6/2003  |
| JP | 2006-004052 | 1/2006  |

* cited by examiner

Primary Examiner — Chun-Kuan Lee
(74) Attorney, Agent, or Firm — Novak Druce + Quigg LLP

(57) ABSTRACT

In accordance with an aspect of the present invention, an input device includes: a state detection portion to detect a state of a connected external device; a signal generation portion to generate a pulse signal predetermined for the detected state; a signal detection portion responsive to detection of a pulse signal to output a state signal predetermined for the detected pulse signal; and an opening/closing portion to open/close a circuit that connects the signal generation portion with the signal detection portion.

4 Claims, 5 Drawing Sheets

| STATE SIGNAL | INTERRUPT TERMINAL | PROCESS ASSIGNED TO BUTTON A |
|---|---|---|
| REPLAY | FIRST PORT | FILE DELETION |
| IMAGE PICKUP | SECOND PORT | FLASH LAMP SETTING |

INPUT DEVICE

This application is based on Japanese Patent Application No. 2009-248518 filed with Japan Patent Office on Oct. 29, 2009, the entire content of which is hereby incorporated by reference.

BACKGROUND OF THE INVENTION

1. Field of the Invention

The present invention relates to an input device, and more particularly to an input device suitable for electronic equipment having operation keys small in number.

2. Description of the Related Art

Conventional electronic equipment contains a microcomputer to allocate a single key among a plurality of processes. The microcomputer allows switchover among a plurality of states and determines a process to be executed in accordance with a combination of the selected state and the pressed key. Therefore, the microcomputer cannot determine a process to be executed unless the state selected when a key is pressed is not identified.

For example, a conventionally known key input device includes a key matrix portion including an ID code generating circuit, and a code conversion portion. The code conversion portion performs key-scan on the key matrix portion using an X bus for strobe signal output and a Y bus for key address input. The code conversion portion takes in an ID code from the Y bus through an ID code identifying portion. In this key input device, an ID code is set by using a particular signal output from the X bus initially or at the start of key-scan to temporarily clamp a particular line of the Y bus at a prescribed logic level.

The conventional key input device outputs the ID code to the Y bus initially or at the start of key-scan and therefore cannot perform ID code setting and key-scan simultaneously. Thus, the ID code has to be set every time the microcomputer of the electronic equipment changes states. Accordingly, a prescribed time is required before key-scan is started.

SUMMARY OF THE INVENTION

In accordance with an aspect of the present invention, an input device includes: a state detection portion to detect a state of a connected external device; a signal generation portion to generate a pulse signal predetermined for the detected state; a signal detection portion responsive to detection of a pulse signal to output a state signal predetermined for the detected pulse signal; and an opening/closing portion to open/close a circuit that connects the signal generation portion with the signal detection portion.

The foregoing and other features, aspects and advantages of the present invention will become more apparent from the following detailed description of the present invention when taken in conjunction with the accompanying drawings.

DESCRIPTION OF THE PREFERRED EMBODIMENTS

Figure 1:
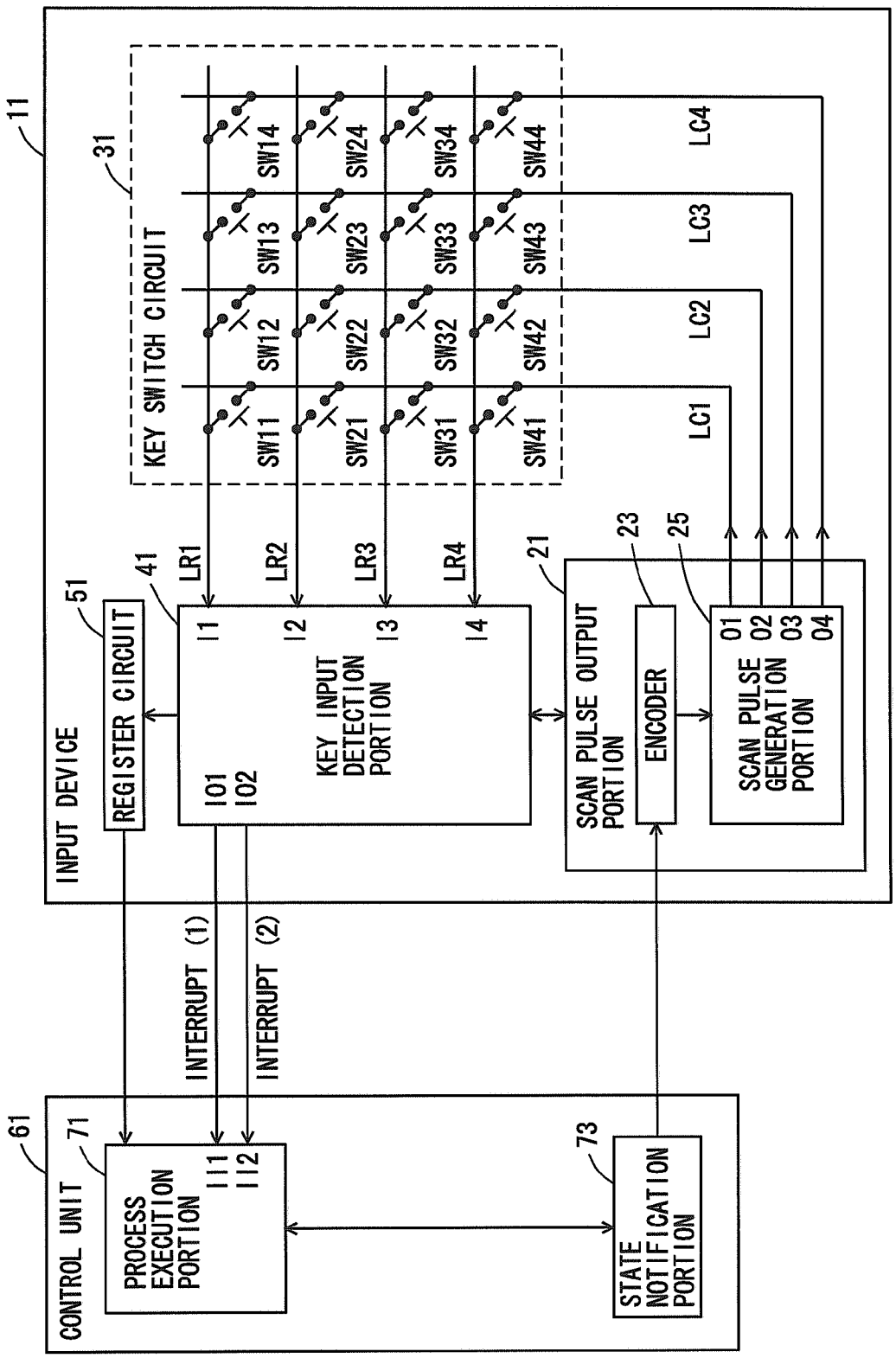
FIG. 1 is a block diagram showing a configuration of an input device in an embodiment of the present invention, together with a control unit of a digital still camera.

In the following, an embodiment of the present invention will be described with reference to the figures. In the following description, the same parts are denoted with the same reference numerals. Their names and functions are also the same. Therefore, a detailed description thereof will not be repeated.

An input device in the present embodiment is applied as a user interface of electronic equipment. Here, the input device is applied to a digital still camera as an example of electronic equipment, by way of example. A digital still camera, which is well known and of which description is not repeated here, changes between an image pickup state in which an image is picked up and a replay state in which the picked-up image is displayed, in accordance with the user's operation. In each state, a plurality of predetermined processes are executed. The processes in the image pickup state include, for example, an exposure-controlling process, an automatic focusing process, and image processing of correcting the picked-up image. The processes in the replay state include, for example, a process of deleting or editing the stored image and a process of continuously replaying images.

FIG. 1 is a block diagram showing a configuration of an input device 11 in the present embodiment, together with a control unit of a digital still camera. Referring to FIG. 1, input device 11 includes a scan pulse output portion 21, a key switch circuit 31, a key input detection portion 41, and a register circuit 51. A control unit 61 is a device external to input device 11.

Scan pulse output portion 21 includes an encoder 23 and a scan pulse generation portion 25. Encoder 23 receives, from a state notification portion 73 of control unit 61 as described later, a state set in the digital still camera, in other words, a state signal indicating a state in which control unit 61 operates. This state signal is input once every time the digital still camera has its state changed. Encoder 23 outputs, to scan pulse generation portion 25, code data predetermined for a state input from state notification portion 73. In other words, encoder 23 stores a table in which code data is associated with each of a plurality of states, and outputs the code data corresponding to the input state to scan pulse generation portion 25.

The number of bits of code data is not specifically limited and is set in accordance with the number of states that can be switched by the digital still camera. Here, the digital still camera may assume two states, namely, the image pickup state and the replay state. So, code data having a data length of one bit will suffice, wherein the code data corresponding to the image pickup state is "0" and the code data corresponding to the replay state is "1."

Scan pulse generation portion 25 generates scan pulses (pulse signal) including code data received from encoder 23. Scan pulse generation portion 25 selects one of four output terminals O1, O2, O3, O4 connected with four output lines LC1, LC2, LC3, LC4, in order, and outputs scan pulses to the selected output terminal for a first prescribed period of time T1. Scan pulse generation portion 25 outputs scan pulses generated at intervals of a second prescribed time (T2) to the selected one of the four output terminals O1, O2, O3, O4 for a prescribed period of time (T1). Specifically, scan pulse generation portion 25 outputs scan pulses to the selected one of the four output terminals O1, O2, O3, O4 at intervals of time period T2 for period T1 and keeps, of the four output terminals O1, O2, O3, O4, the other three terminals to which no scan pulse is output, at a High state. Here, T1>T2. For example, given T1=10×T2, for period T1, ten scan pulses are output to output terminal O1 and High is output to the other output terminals O2, O3, O4. For the next period T1, ten scan pulses are output to output terminal O2 and High is output to the other output terminals O1, O3, O4. Furthermore, for the next period T1, ten scan pulses are output to output terminal O3 and High is output to the other output terminals O1, O2, O4. Still further, for the next period T1, ten scan pulses are output to output terminal O4 and High is output to the other output terminals O1, O2, O3.

Scan pulse generation portion 25 repeats the process of outputting scan pulses to each of the four output terminals O1, O2, O3, O4, in order, for period T1 until the next code data is input from encoder 23. The scan pulse is a pulse signal having a combination of a High state and a Low state in a predetermined period.

Figures 2, 3:
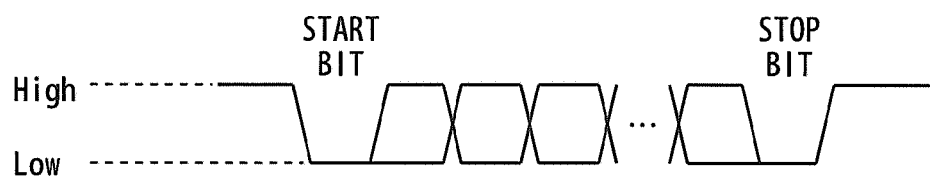
FIG. 2 shows an example of scan pulses.
FIG. 3 shows an example of the relation between the processes executed by the digital still camera, the states of the digital still camera, and interrupt terminals.

FIG. 2 shows an example of the scan pulses. Referring to FIG. 2, the scan pulses include a start bit (Low) of one bit, code data of N bits (N is a positive integer), and a stop bit (Low) of one bit.

Returning to FIG. 1, key input detection portion 41 includes four input terminals I1, I2, I3, I4. The four input terminals I1, I2, I3, I4 are connected with input lines LR1, LR2, LR3, LR4, respectively. The potential of input lines LR1, LR2, LR3, LR4 is set High by a pull-up resistor. Key switch circuit 31 includes sixteen switches SW11-SW14, SW21-SW24, SW31-SW34, SW41-SW44, which are connected with four output lines LC1, LC2, LC3, LC4 and four input lines LR1, LR2, LR3, LR4, respectively.

For example, switch SW11 has one end connected to output line LC1 and the other end connected to input line LR1. Therefore, when switch SW11 is pressed by the user, switch SW11 electrically connects output line LC1 with input line LR1. Switch SW21 has one end connected to output line LC1 and the other end connected to input line LR2. Therefore, when switch SW21 is pressed by the user, switch SW21 electrically connects output line LC1 with input line LR2. Switch SW31 has one end connected to output line LC1 and the other end connected to input line LR3. Therefore, when switch SW31 is pressed by the user, switch SW31 electrically connects output line LC1 with input line LR3. Switch SW41 has one end connected to output line LC1 and the other end connected to input line LR4. Therefore, when switch SW41 is pressed by the user, switch SW41 electrically connects output line LC1 with input line LR4.

Key input detection portion 41 is synchronized with scan pulse output portion 21 and receives, from scan pulse output portion 21, to which of output terminals O1, O2, O3, O4 scan pulses are output. Thus, key input detection portion 41 detects that any one of switches SW11, SW21, SW31, SW41 is pressed by the user while it is receiving that scan pulses are output from scan pulse output portion 21 to output terminal O1. Key input detection portion 41 detects that any one of switches SW12, SW22, SW32, SW42 is pressed by the user while it is receiving that scan pulses are output from scan pulse output portion 21 to output terminal O2. Key input detection portion 41 detects that any one of switches SW13, SW23, SW33, SW43 is pressed by the user while it is receiving that scan pulses are output from scan pulse output portion 21 to output terminal O3. Key input detection portion 41 detects that any one of switches SW14, SW24, SW34, SW44 is pressed by the user while it is receiving that scan pulses are output from scan pulse output portion 21 to output terminal O4.

Here, a description will be made to an operation of key input detection portion 41 for period T1 during which scan pulse generation portion 25 outputs scan pulses to output terminal O1, by way of example. In a state in which switches SW11, SW21, SW31, SW41 are not pressed by the user, the four input terminals I1, I2, I3, I4 of key input detection portion 41 are set High. When switch SW11 is pressed by the user, output line LC1 is electrically connected with input line LR1 so that scan pulses are input to input terminal I1 of key input detection portion 41. Upon detecting the scan pulses at input terminal I1, key input detection portion 41 extracts code data included in the scan pulses and also detects that switch SW11 is pressed by the user.

When switch SW21 is pressed by the user, output line LC1 is electrically connected with input line LR2 so that scan pulses are input to input terminal I2 of key input detection portion 41. Upon detecting the scan pulses at input terminal I2, key input detection portion 41 extracts code data included in the scan pulses and also detects that switch SW21 is pressed by the user.

When switch SW31 is pressed by the user, output line LC1 is electrically connected with input line LR3 so that scan pulses are input to input terminal I3 of key input detection portion 41. Upon detecting the scan pulses at input terminal I3, key input detection portion 41 extracts code data included in the scan pulses and also detects that switch SW31 is pressed by the user.

When switch SW41 is pressed by the user, output line LC1 is electrically connected with input line LR4 so that scan pulses are input to input terminal I4 of key input detection portion 41. Upon detecting the scan pulses at input terminal I4, key input detection portion 41 extracts code data included in the scan pulses and also detects that switch SW41 is pressed by the user.

Upon detecting the switch pressed by the user, key input detection portion 41 updates a switch table stored by register circuit 51. The switch table shows whether each of sixteen switches, namely, SW11-SW14, SW21-SW24, SW31-SW34, SW41-SW44, is pressed or not. Specifically, the switch table has a storage area corresponding to each of switches SW11-SW14, SW21-SW24, SW31-SW34, SW41-SW44. If the value in the storage area is "0," the corresponding switch is not pressed, and if it is "1," the corresponding switch is pressed. The location of the storage area specifies one of switches SW11-SW14, SW21-SW24, SW31-SW34, SW41-SW44, and the value stored in the storage area specifies one of the pressed state and the not-pressed state.

Key input detection portion 41 further includes two interrupt signal output terminals IO1, IO2 for outputting an interrupt signal. Upon detecting that any one of sixteen switches SW11-SW14, SW21-SW24, SW31-SW34, SW41-SW44 is pressed, key input detection portion 41 outputs an interrupt signal to one of interrupt signal output terminals IO1, IO2 that is predetermined corresponding to the detected code data. Here, interrupt signal output terminal IO1 is set for code data "0" corresponding to the image pickup state, and interrupt signal output terminal IO2 is set for code data "1" corresponding to the replay state. When code data "0" is detected, key input detection portion 41 outputs an interrupt signal to interrupt signal output terminal IO1. When code data "1" is detected, key input detection portion 41 outputs an interrupt signal to interrupt signal output terminal IO2.

Here, register circuit 51 stores which of sixteen switches SW11-SW14, SW21-SW24, SW31-SW34, SW41-SW44 is pressed. Instead, a predetermined key code corresponding to the pressed one among the sixteen switches SW11-SW14, SW21-SW24, SW31-SW34, SW41-SW44 may be output to control unit 61. In this case, register circuit 51 is unnecessary.

Control unit 61 is a central processing unit (CPU) which controls the whole of the digital still camera equipped with input device 11. Control unit 61 includes a process execution portion 71 for executing a function of the digital still camera and a state notification portion 73 for notifying input device 11 of a state of the digital still camera.

Process execution portion 71 is connected with input device 11 and includes a first port II1 and a second port II2 for receiving an interrupt signal. Process execution portion 71 receives an interrupt signal at one of first port II1 and second port II2 to read the table stored in register circuit 51 thereby to determine which of the sixteen switches SW11-SW14, SW21-SW24, SW31-SW34, SW41-SW44 has been pressed. A process is then executed, which is specified corresponding to the one of first port II1 and second port II2 that has received the interrupt signal and the one of the sixteen switches SW11-SW14, SW21-SW24, SW31-SW34, SW41-SW44 that has been pressed.

A process to be executed by process execution portion 71 is specified corresponding to each of switches SW11-SW14, SW21-SW24, SW31-SW34, SW41-SW44 depending on a state of the digital still camera. For example, a program executed by control unit 61 includes a subroutine program associated with a combination of a state of the digital still camera and a switch (operated by the user). Control unit 61 allows the process to branch, based on the state of the digital still camera and the switch pressed by the user, thereby determining a subroutine program to be executed.

FIG. 3 shows the relation between the processes executed by the digital still camera, the states of the digital still camera, and the interrupt terminals. Referring to FIG. 3, an item of state signal, an item of interrupt terminal, and an item of assigned process are included. If an interrupt signal is input to first port II1 and if pressing a switch corresponding to a button A is stored in register circuit 51, then process execution portion 71 executes a subroutine program in which a file deletion process is described. If an interrupt signal is input to second port II2 and if pressing the switch corresponding to button A is stored in register circuit 51, then process execution portion 71 executes a subroutine program in which a process of setting a flash lamp is described.

When an interrupt signal is input to one of first port II1 and second port II2, process execution portion 71 determines a subroutine program to be executed and then executes a process only by referring to register circuit 51 to determine which switch is pressed. Therefore, it is neither necessary to determine whether the digital still camera is in the image pickup state or the replay state, nor to execute a check process for such a determination, thereby increasing the processing speed. The subroutine programs include a program in which a process of switching the states of the digital still camera is described. When executing the process of switching the states of the digital still camera, process execution portion 71 outputs a signal to state notification portion 73 to indicate the state after switching.

State notification portion 73 receives a signal indicating the state after switching from process execution portion 71 to output to input device 11 a state signal predetermined for the state after switching.

Figure 4:
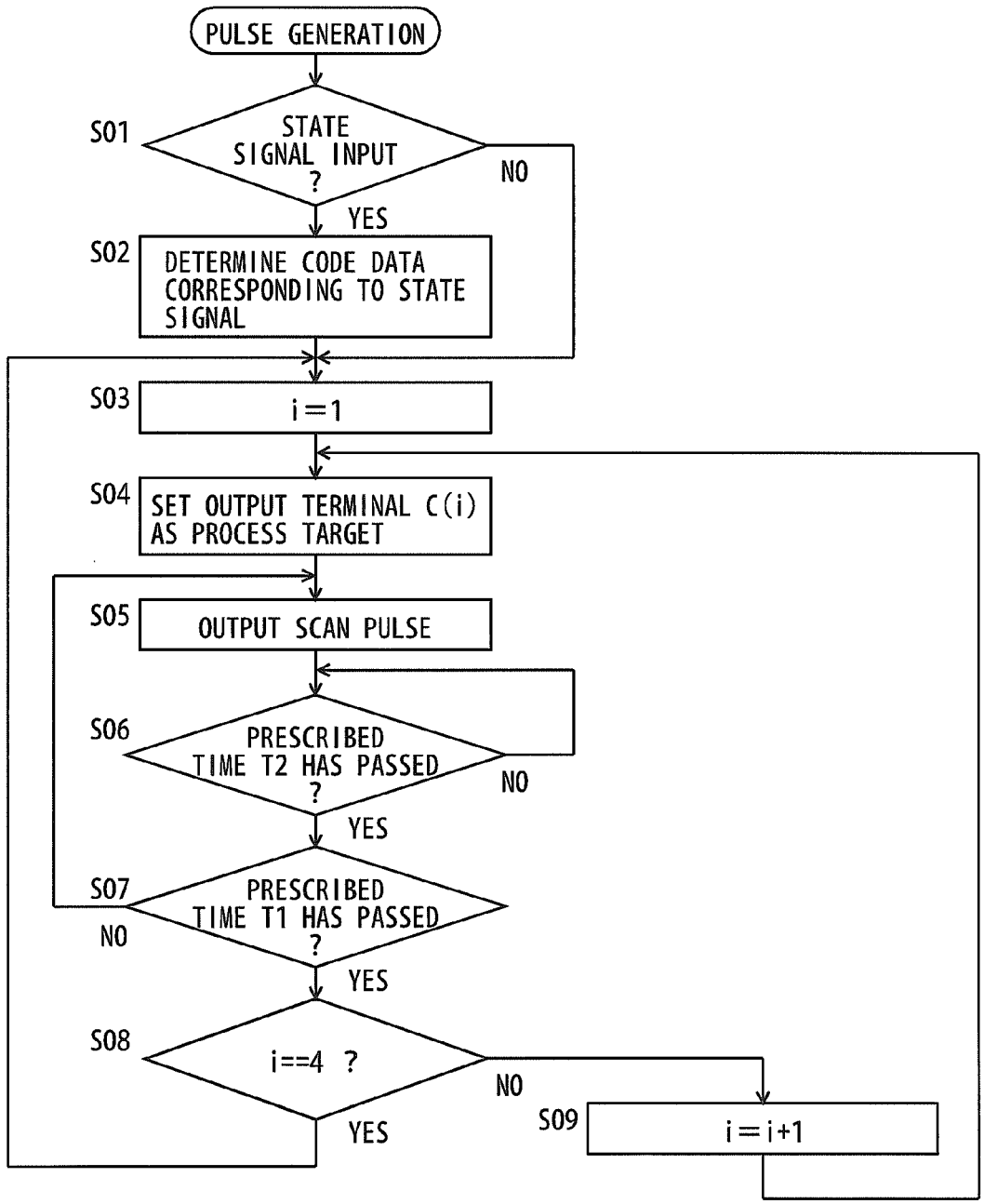
FIG. 4 is a flowchart showing an exemplary flow of a pulse generation process executed by a scan pulse output portion.

FIG. 4 is a flowchart illustrating an exemplary flow of a pulse generation process executed by the scan pulse output portion. Referring to FIG. 4, scan pulse output portion 21 determines whether a state signal is input from control portion 61 (step S01). If a state signal is input, the process proceeds to step S02. If not, the process proceeds to step S03. It is noted that immediately after the power is turned on, the process waits until an initial state signal is input.

In step S02, predetermined code data corresponding to the state signal is determined, and the process then proceeds to step S03. In step S03, a variable i is set to 1. Variable i is a variable for specifying the output terminal that outputs scan pulses, among output terminals O1, O2, O3, O4. Here, a sequence O(i) is used, wherein output terminals O1, O2, O3, O4 are associated with sequences O(1), O(2), O(3), O(4), respectively.

In step S04, output terminal O(i) is set as the target of the process of outputting scan pulses. If i is set to "1," output terminal O1 is set as the process target. If i is set to "2," output terminal O2 is set as the process target. If i is set to "3," output terminal O3 is set as the process target. If i is set to "4," output terminal O4 is set as the process target.

Then, scan pulses are output to the one of output terminals O1-O4 that is set as the process target (step S05). The scan pulses include a Low start bit, code data bits, a Low stop bit. It is then determined whether prescribed time T2 has passed since the scan pulse was output (step S06). The prescribed time has a predetermined value set as a scan pulse transmission interval. It may be set depending on the transfer rate of the scan pulses and the bit length of the scan pulses. The process waits until prescribed time T2 has passed. If prescribed time T2 has passed, the process proceeds to step S07.

In step S07, it is determined whether prescribed time T1 has passed since the initial scan pulse was output. If prescribed time T1 has passed, the process proceeds to step S08. If not, the process returns to step S05. Prescribed time T1 is a predetermined period of time during which the scan pulses are continuously output to the one of output terminals O1-O4 that is set as the process target. The number of times a scan pulse is output to the one of output terminals O1-O4 that is set as the process target may be counted, so that the scan pulses are output until the count value reaches a predetermined number of times.

In step S08, it is determined whether variable i is equal to "4." If variable i is equal to "4," the process returns to step S03. If not, the process proceeds to step S09. In step S09, variable i is set to a value incremented by one, and the process returns to step S04. This is to change the process target among output terminals O1-O4.

Figure 5:
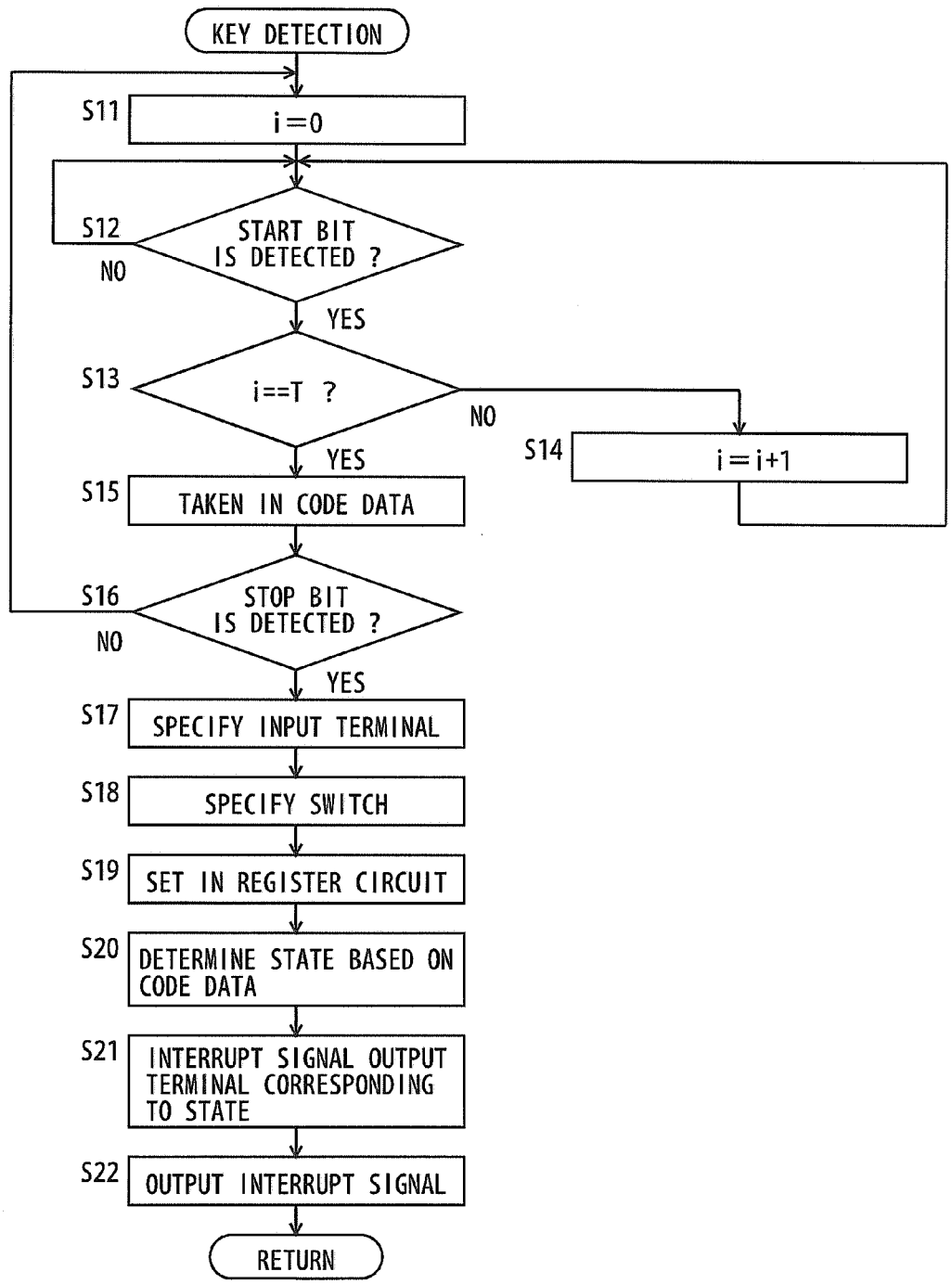
FIG. 5 is a flowchart showing an exemplary flow of a key detection process executed by a key input detection portion.

FIG. 5 is a flowchart showing an exemplary flow of a key detection process executed by the key input detection portion. Referring to FIG. 5, key input detection portion 41 sets variable i to "0" (step S11). Variable i is a counter for counting the number of times a start bit of scan pulse is detected.

In step S12, it is determined whether a start bit is detected at one of input terminals I1, I2, I3, I4. Here, it is determined whether a one-bit Low signal is detected or not. The process waits until a start bit is detected at any one of input terminals I1, I2, I3, I4. If a start bit is detected at any one of input terminals I1, I2, I3, I4, the process proceeds to step S13.

In step S13, it is determined whether variable i is equal to a threshold value T. If variable i is equal to threshold value T, the process proceeds to step S15. If not, the process proceeds to step S14. In step S14, variable i is set to the value incremented by one, and the process then returns to step S12. To distinguish the scan pulse from chattering, the scan pulse is identified by detecting a start bit T times. Here, T=4.

In step S15, code data is taken in. The code data is taken in by analyzing the scan pulses input following the start bit. Furthermore, it is determined whether a stop bit is detected following the code data (step S16). Here, it is determined whether a one-bit Low signal is detected following the code data. If a stop bit is detected, the process proceeds to step S17. If not, the process returns to step S11. If no stop bit is detected, the start bit and the taken-in code data that have been detected until then are handled as chattering. A detection error is thus prevented. It is noted that the scan pulses may be configured only with a start bit and code data without using a stop bit.

In step S17, the one of input terminals I1, I2, I3, I4 at which the start bit is detected in step S12 is specified. Then, based on the specified input terminal, a switch is specified (step S18). Specifically, a switch is specified based on, among output terminals O1, O2, O3, O4, the output terminal that outputs the scan pulse at the time of detection of the start bit in step S12 in the above-mentioned pulse generation process, and the input terminal specified in step S17.

In step S19, it is set in the register circuit that the specified switch is pressed. In the next step S20, a predetermined state for the code data taken in in step S15 is determined. Here, code data "0" corresponds to the image pickup state and code data "1" corresponds to the replay state.

Then, of interrupt signal output terminals IO1, IO2, the one that is predetermined for the determined state is determined. Here, interrupt signal output terminal IO1 corresponds to the image pickup state, and interrupt signal output terminal IO2 corresponds to the replay state. In step S22, an interrupt signal is output to the one of interrupt signal output terminals IO1, IO2 that is determined in step S21. The process then ends.

<Modification>

Figure 6:
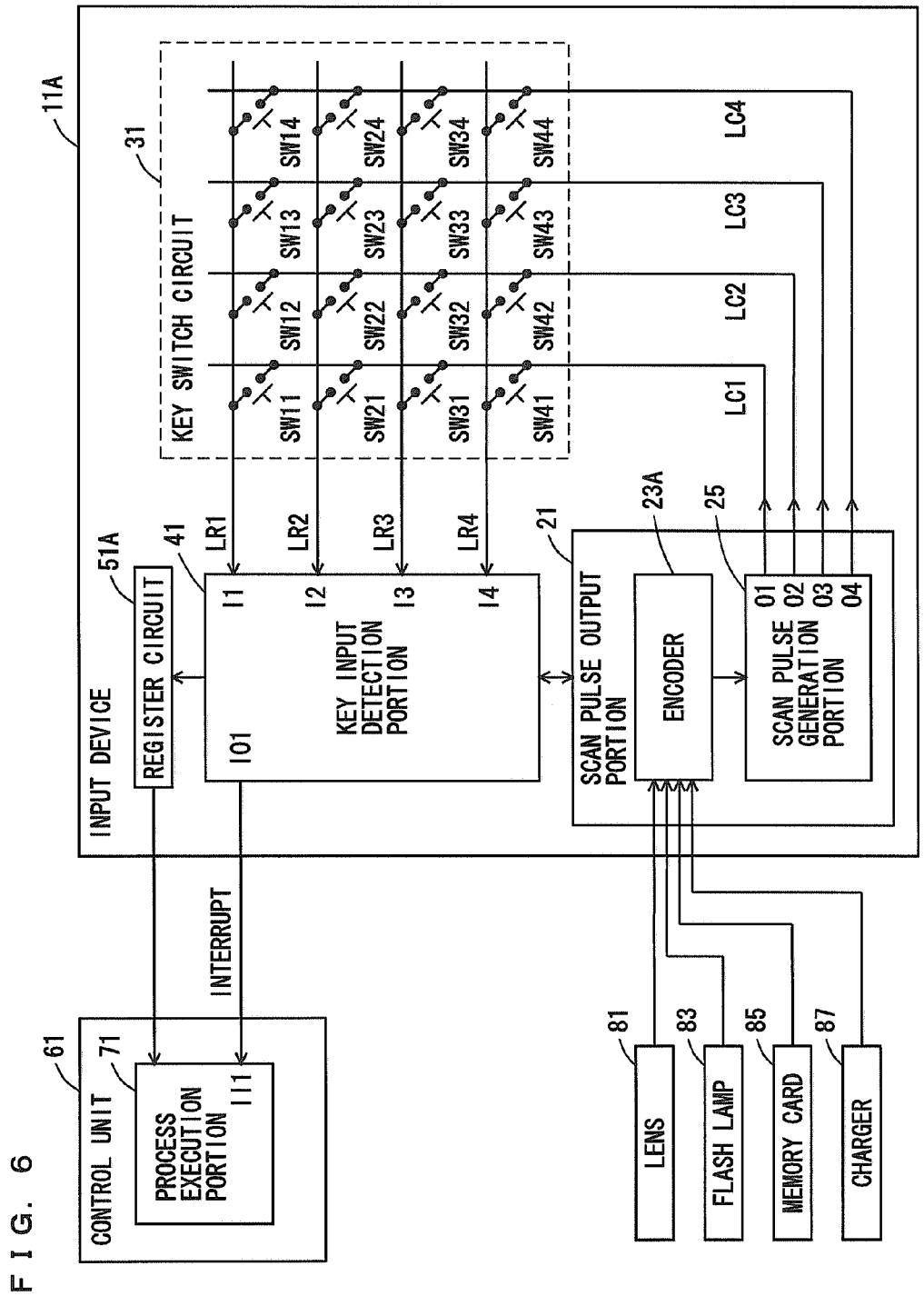
FIG. 6 is a diagram showing an exemplary input device in a modified embodiment.

FIG. 6 is a diagram showing an exemplary input device in a modified embodiment. Referring to FIG. 6, an input device 11A in a modified embodiment differs from input device 11 shown in FIG. 1 in that encoder 23 and register circuit 51 are replaced by an encoder 23A and a register circuit 51A, respectively. Input device 11 shown in FIG. 1 receives a state signal from control unit 61, whereas encoder 23A of input device 11A in the modified embodiment detects a connection state of a lens 81, a flash lamp 83, a memory card 85, and a charger 87 mounted on the digital still camera and detects a state depending on a combination of the connected lens 81, flash lamp 83, memory card 85, and charger 87. Lens 81, flash lamp 83, memory card 85, and charger 87 mounted on the digital still camera are devices external to input device 11A.

Encoder 23A specifies a combination of the connected devices (connection state) by detecting which of lens 81, flash lamp 83, memory card 85, and charger 87 is connected to the digital still camera. Encoder 23A outputs, to scan pulse generation portion 25, code data predetermined for the specified combination. In other words, encoder 23A stores a table in which a plurality of combinations are each associated with code data, and encoder 23A outputs the code data corresponding to the specified combination to scan pulse generation portion 25. Here, since there are six combinations in which lens 81, flash lamp 83, memory card 85, and charger 87 are connected, code data having a data length of four bits will suffice.

Register circuit 51A stores switch tables corresponding to the respective connection states of lens 81, flash lamp 83, memory card 85, and charger 87. Specifically, six switch tables are stored corresponding to the respective six connection states. Key input detection portion 41 specifies a switch table corresponding to the code data, from the six switch tables, and overwrites the corresponding storage area of the specified switch table. The corresponding storage area is the storage area allocated to the pressed switch among switches SW11-SW14, SW21-SW24, SW31-SW34, SW41-SW44.

It is noted that register circuit 51A in the modified embodiment may be applied to the above-noted input device 11. Conversely, register circuit 51 of the above-noted input device 11 may be applied to input device 11A in the modified embodiment. In this case, six interrupt signal output terminals are required corresponding to the six connection states.

In the present embodiment, scan pulse generation portion 25 selects one of the four output terminals O1, O2, O3, O4 in order and outputs a plurality of scan pulses to the selected output terminal for a prescribed period of time T1.

Alternatively, one scan pulse may be output to the four output terminals O1, O2, O3, O4, in order. Specifically, one scan pulse is output once to output terminal O1, thereafter one scan pulse is output once to output terminal O2, then one scan pulse is output once to output terminal O3, and then one scan pulse is output once to output terminal O4. In this case, key input detection portion 41 identifies the scan pulse on condition that a start bit is detected successively T times at each of the four input terminals I1, I2, I3, I4, similarly as described above.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An input device comprising:
   a state detection portion to, upon accepting a state signal output by a connected external device, detect a state of said connected external device;
   a signal generation portion to generate a pulse signal predetermined for said detected state;
   a signal detection portion, responsive to detection of said pulse signal generated by said signal generation portion, to output a state signal predetermined for a detected pulse signal to said external device;
   an opening/closing portion to open/close a circuit that connects said signal generation portion with said signal detection portion,
   wherein said signal detection portion, when said opening/closing portion closes the circuit, is connected with said signal generation portion and detects the pulse signal generated by said signal generation portion; and
   wherein the pulse signal generated by the signal generation portion when said opening/closing portion closes the circuit is simultaneously detected with accepting the state signal for detecting the state of said connected external device.

2. The input device according to claim 1,
   wherein said state detection portion includes a connection detection portion to detect that one or more external devices are connected;
   wherein among a plurality of states predetermined corresponding to a plurality of combinations in which said one or more external devices are connected, said state detection portion is configured to detect a state corresponding to a combination of said one or more external devices detected as being connected by said connection detection portion is detected.

3. The input device according to claim 1,
   wherein said signal generation portion is connected to said signal detection portion through a plurality of circuits, and in order to output a pulse signal to any one of said plurality of circuits, said signal generation portion is configured to:
   select one of said plurality of circuits in order; and
   output a pulse signal to the selected one of said plurality of circuits for a prescribed period;
   wherein a plurality of said opening/closing portions are respectively provided for said plurality of circuits; and
   wherein said signal detection portion is configured to output, in addition to said state signal, identification information for identifying one of said plurality of opening/closing portions that is provided for a circuit that receives a pulse signal from said signal generation portion when said signal detection portion detects the pulse signal.

4. The input device according to claim 1,
   further comprising:
   a plurality of said opening/closing portions, and
   wherein:
   said signal detection portion, in response to detecting the pulse signal generated by said signal generation portion, outputs to said state signal, identification information for identifying one of said plurality of opening/closing portions that closes said circuit; and
   said connected external device executes a process determined by said state signal output by said signal detection portion and said identification information.

* * * * *